United States Patent

DeGuire et al.

[11] Patent Number: 5,352,485
[45] Date of Patent: Oct. 4, 1994

[54] SYNTHESIS OF METAL OXIDE THIN FILMS

[75] Inventors: Mark R. DeGuire, Cleveland Heights; Arthur H. Heuer, Cleveland; Chaim N. Sukenik, Cleveland Heights, all of Ohio

[73] Assignee: Case Western Reserve University, Cleveland, Ohio

[21] Appl. No.: 28,594

[22] Filed: Apr. 8, 1993

[51] Int. Cl.$^5$ .............................................. B05D 3/02
[52] U.S. Cl. .................................. 427/226; 427/387; 427/407.2; 427/409; 525/475; 528/485
[58] Field of Search ..................... 528/485; 525/475; 427/226, 387, 409, 407.2, 435

[56] References Cited

U.S. PATENT DOCUMENTS 4,911,992  3/1990  Haluska et al. ................ 427/430.1
4,996,075  2/1991  Ogawa et al. .................. 427/430.1

OTHER PUBLICATIONS

Lee et al, Inorganic Analogues of Langmuir-Blodgett Films: Adsorption of Ordered Zirconium 1, 10-Decanebisphosphonate Multilayers on Silicon Surfaces, J. Am. Chem. Soc. 110(2), pp. 618–620, 1988.

Netzer et al, A New Approach to Construction of Artificial Monolayer Assemblies, J. Am. Chem. Soc. 105(3), pp. 674–676, 1983.

Tarasevich, et al., "Synthesis of Ceramic Ultrastructures Utilizing Biological Processes," Chemical Processing of Advanced Materials, John Wiley and Sons, Inc., Hench, et al., ed., 1992, pp. 529–541.

Netzer, et al., "A New Approach to Construction of Artificial Monolayer Assemblies," Journal of the American Chemical Society, vol. 105, No. 3, 1983.

Balachander, et al., "Functionalized Siloxy-Anchored Monolayers With Exposed Amino, Azido, Bromo, or Cyano Groups", Tetrahedron Letters, No. 5593, 1988.

Tillman, et al., "Formation of Multilayers by Self-Assembly", Langmuir, vol. 5, 1989, pp. 101–111.

Putvinski, et al., "Self-Assembly of Organic Multilayers with Polar Order Using Zirconium Phosphate Bonding between Layers," vol. 6, 1990, pp. 1567–1571, Langmuir.

Balachander, et al., "Monolayer Transformation by Nucleophilic Substitution: Applications to the Creation of New Monolayer Assemblies", Langmuir, vol. 6, 1990, pp. 1621–1627.

Tarasevich, et al., "Ceramic Oxide Thin Film Formation Utilizing Biological Processes", Mat. Res. Soc. Symp. Proc., vol. 174, 1990, pp. 51–58.

Heuer, et al., "Innovative Materials Processing Stratagies: A Biomimetic Approach," Science, vol. 255, 28 Feb. 1992, pp. 1098–1105.

Rieke, et al., "Biomimetic Thin-Film Synthesis", Supramolecular Architecture: Synthetic Control in Thin Films and Solids, Chapter 6, Ed. T. Bein, ACS Symposium Series 499, 1992, ./ 61–73.

"Preparation and Properties of Well-Defined Magnetic Particles," MRS Bulletin, Dec. 1989, pp. 35–40.

Haile, et al., "Aqueous Precipitation of Spherical Zinc Oxide Powders for Varistor Applications," Journal of the American Ceramic Society, vol. 72, No. 3, 1989, pp. 2004–2008.

Gulliver, et al., "Hydrolytic Condensation of Tin(IV) Alkoxide Compounds to Form Particles with Well-Defined Morphology," Journal of the American Ceramic Society, vol. 74, No. 5, 1991, pp. 1091–1094.

Heywood, et al., "Organic Template-Directed Inorganic Crystallization: Oriented Nucleation of BaSO4 under Compressed Langmuir Monolayers", Journal of the American Chemical Society, vol. 114, 1992, pp. 4681–4686.

(List continued on next page.)

Primary Examiner—Terry J. Owens
Assistant Examiner—Erma Cameron
Attorney, Agent, or Firm—Fay, Sharpe, Beall, Fagan, Minnich & McKee

[57] ABSTRACT

Iron and titanium oxide thin films are deposited onto functionalized self-assembled monolayers (SAMs) which are bonded to silicon or glass substrates. The resulting oxide thin films have ordered, uniform densely packed crystalline structures.

25 Claims, 4 Drawing Sheets

OTHER PUBLICATIONS

Johnson, Jr., "Sol-Gel Processing of Ceramics and Glass," *American Ceramic Society Bulletin.*, vol. 64, No. 12, 1985, pp. 1597–1602.

Matijevic, ed., "Fine Particles: Science and Technology," *MRS Bulletin*, Dec. 1989, pp. 18–22.

Sugimoto, "Preparation and Characterization of Monodispersed Colloidal Particles, " *MRS Bulletin*, Dec. 1989, pp. 23–28.

Kirby, "Alkoxide Synthesis Techniques for $BaTiO_3$, " *Mat. Res. Bull.*, vol. 23, 1988, pp. 881–890.

Calvert, et al., "Synthetic and Biological Composites form by In Situ Precipitation," *Journal of Materials Science*, vol. 23, 1988, pp. 3801–3815.

Misawa, et al. "The Mechanism of Formation of Iron Oxide and Oxyhydroxides in Aqueous Solutions at Room Temperature," *Corrosion Science*, vol. 14, 1974, pp. 131–149.

Matijevic, et al. "Ferric Hydrous Oxide Sols," *Journal of Colloid and Interface Science*, vol. 63, No. 3, Mar. 1, 1978, pp. 509–524.

Sapieszko, et al. "Preparation of Well-Defined Colloidal Particles by Thermal Decomposition of Metal Chelates," *Journal of Colloid and Interface Science*, vol. 74, No. 2, Apr. 1980, pp. 405–422.

Couling, et al., "The Influence of Inorganic Phosphate on the Crystallization of Magnetite ($Fe_3O_4$) from Aqueous Solution," *J. Chem. Soc. Chem. Commun.*, 1985, pp. 1713–1715.

SYNTHESIS OF METAL OXIDE THIN FILMS

FIELD OF THE INVENTION

The present invention relates to the synthesis of metal oxide films and, more particularly, to a process for synthesizing metal oxide films from liquid solutions on to ordered organic monolayers. The resulting metal oxide film has a highly uniform packing density and particle size.

BACKGROUND OF THE INVENTION

The field of thin film ceramics has seen rapid growth in recent years. This activity stems in large part from the attractive and often unique properties that ceramic materials bring to a wide variety of applications, including: thin film ferroelectrics; magnetic recording; multilayer coatings for lenses, windows, and laser optics; hard, corrosion-resistant coatings for optical fibers; filters for electromagnetic radiation; acousto-optic devices; and electrochemical sensors for detection of combustible or hazardous species in gases. Another essential ingredient in these developments has been the growing progress in thin film deposition technology, involving gas phase techniques such as chemical vapor depositions sputtering, laser ablation, and evaporation.

Despite their successes, these deposition techniques have some significant shortcomings. Capital equipment costs can be prohibitively high, especially for large-volume applications. There is considerable art associated with the design of the deposition systems and with the control of the operating parameters (e.g., to correct for differential deposition rates between components in a multicomponent film). The most common techniques still primarily involve line-of-sight deposition, with limited applicability to complex surfaces and shapes. Most importantly, achievement of the desired properties often requires that the substrate be heated to significant temperatures (several hundreds of °C.), either during deposition or subsequently, to convert the usually amorphous as-deposited material into a well-ordered crystalline film. This significantly limits the capabilities of thin film deposition technology for many metal and polymeric substrates. When a specific crystallographic orientation of the thin film is desired, the choice of substrate is usually further restricted to a single-crystal material whose surface interatomic spacing closely matches that of the desired crystalline film, enabling epitaxial growth.

Liquid phase thin film preparation techniques are also known in the art and involve homogeneous precipitation of colloidal particles or gel solutions which are cast as films onto substrates. These methods include sol-gel, colloidal particle systems, spray pyrolysis, and electroless and electrodeposition. Obstacles are associated with these techniques with respect to thin film formation. Colloidal systems, for example, have low densities and uncontrolled microstructures as a result of the use of binder phases or the aggregation of colloidal particles. Polymeric sol-gel solutions generate amorphous and porous structures which manifest in low density films. Problems with film shrinkage and cracking are exhibited during scale up of sol gel techniques. Electroless deposition techniques are essentially limited to metal deposition and call for the use of catalysts for metal reduction and provision of nucleation sites on substrate surfaces.

Both gas phase and liquid phase thin film formation techniques have limitations. Gas phase deposition generally calls for expensive equipment and line of sight deposition. Liquid phase deposition results in cracking and shrinkage. Other limitations and disadvantages exist with respect to known thin film formation techniques.

With the above in mind, numerous instances of inorganic material synthesis by living organisms stand out as striking suggestions for alternate synthetic deposition routes. The microstructures of many shells, teeth, and other biological inorganic structures are remarkably dense and uniform. They often exhibit precise crystallographic relationships maintained over millimeter or centimeter length scales. Mechanical properties in many instances exceed those of identical compounds fabricated via manmade or geological routes. And in all known instances, the materials are synthesized at or near room temperature from aqueous solutions. Furthermore, growth of the inorganic phase usually occurs in the presence of a thin organic substrate, which dictates not only the location of the reaction but the crystallographic orientation and eventual macroscopic shape of the structure.

The present invention is directed to the deposition of metal-containing oxide films onto an organic template commonly referred to as a self-assembled monolayer (SAM). The resulting thin film is a uniform, densely packed structure finding usefulness in a wide variety of areas.

SUMMARY OF THE INVENTION

The present invention is directed to the deposition of metal-containing oxide films onto an organic template. The resulting oxide films range in thickness from less than 5 nm to 100 nm. They are deposited from aqueous or organometallic solutions onto self-assembled organic monolayers (SAMs) on various substrates. The SAM is formed first, from a surfactant containing long-chain hydrocarbons with trichlorosilane ($-SiCl_3$) groups an a first end of each long chain hydrocarbon and a wide range of functionalities (e.g., Br, CN, $SCOCH_3$ SCN, COOMe, $-OH$, $-COOH$, $-SO_3$, $COOCF_3$, etc.) at a second end of the chains. The functional groups on the surface of the SAMs play a key role in initiating formation of the oxide film, although it is the SAM itself which enables a uniform and continuous film to be achieved. The stability of this film structure is such that, in at least the case of Fe-containing deposited layers, the SAM can be removed by heating, leaving behind a continuous, adherent crystalline layer of $Fe_3O_4$ (magnetite) on a single-crystalline silicon substrate.

The SAM forms in a spontaneous, self-assembling process during which the $-SiCl_3$ end bonds covalently via a condensation reaction to an oxide or hydroxide-bearing surface of a substrate such as silicon, glass, or any material capable of forming an oxide surface. Additionally, $Si-O-Si$ bonds form between the individual molecules in the monolayer providing additional stability. The surface to which the SAM bonds can be a bulk oxide, such as glass, or the native oxide on, for example, Si, Ge, Ti, Al or other metals. The covalent bonding is more rugged than in related structures such as Langmuir-Blodgett films, allowing the SAM to survive exposure to fairly aggressive conditions during subsequent processing. Such processing can include in-situ installation and interconversion of exposed surface functionalities. By creating appropriately functionalized SAMs, metal oxides can be induced to form on the SAMs from organometallic or aqueous salt solutions.

Efforts have been made to describe the arrangement and concentration of functional groups on the SAM surface. It is reasonably considered that the long-chain hydrocarbons project at a uniform, near-normal angle to the substrate, presenting an ordered close-packed two-dimensional array to their surroundings. Oxides are formed at the SAM-solution interface to form a metal oxide layer. Further, the ordered surface arrangement of the SAM is believed to induce crystallinity in the forming oxide and ultimately crystallographic texturing, at temperatures not exceeding 100° C.

The present invention provides for a unique use of ordered, rugged organic monolayers (SAMs) whose terminating end groups are chemical moieties specifically chosen to induce formation of oxide layers locally on the organic layer. The invention is also unique in the ability of the SAM to influence favorably the film microstructure, particularly in its adherence, continuity, uniformity, grain size, and crystallographic orientation. These effects can persist in the oxide even if the SAM itself is removed during subsequent heat treatment.

There are several advantages associated with the present invention. One advantage is that there are no restrictions to Line of sight depositions associated with chemical vapor deposition and various other techniques. Complex shapes can therefore be readily coated with metal oxide thin films.

Another advantage is that the depositions can be done at low temperatures (i.e., less than 100° C.).

Another advantage is that capital equipment costs are kept low, primarily when compared to gas phase deposition techniques.

Yet another advantage resides in the ability to obtain specific crystallographic orientations of the films.

Still other advantages and benefits of the invention will become apparent to those skilled in the art upon a reading and understanding of the following detailed description.

BRIEF DESCRIPTION OF THE DRAWINGS

The drawings are included merely to illustrate certain aspects of the present invention.

DETAILED DESCRIPTION OF THE INVENTION

Many biological examples of inorganic layer formation involve an organic substrate. To adapt this strategy for synthetic film by synthesis, metal-containing films, such as those containing Fe, Ti, Sn, Zn or other metals, may be deposited onto organic layers consisting of self-assembled monolayer films (SAM) on substrates such as single-crystal Si wafers or glass functionalized with —OH, —COOH or —$SO_3H$ groups. These may be referred to as terminal functional groups.

Figure 1:
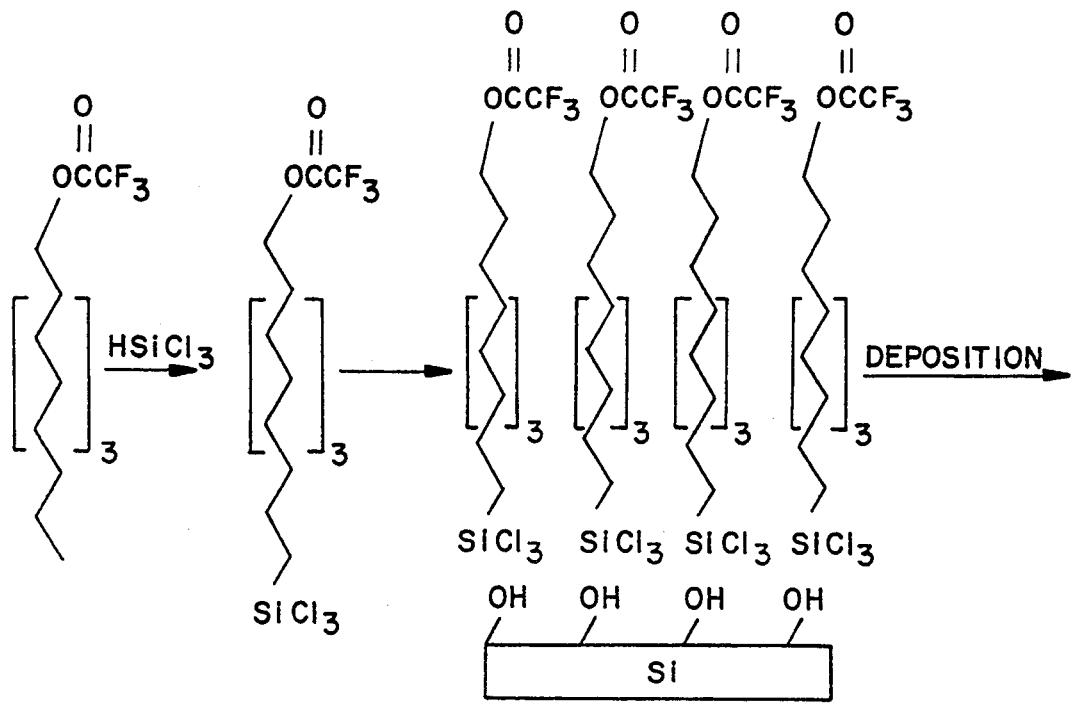
FIG. 1 is a flow diagram showing the synthesis of self-assembled monolayer film.
Figure 1:
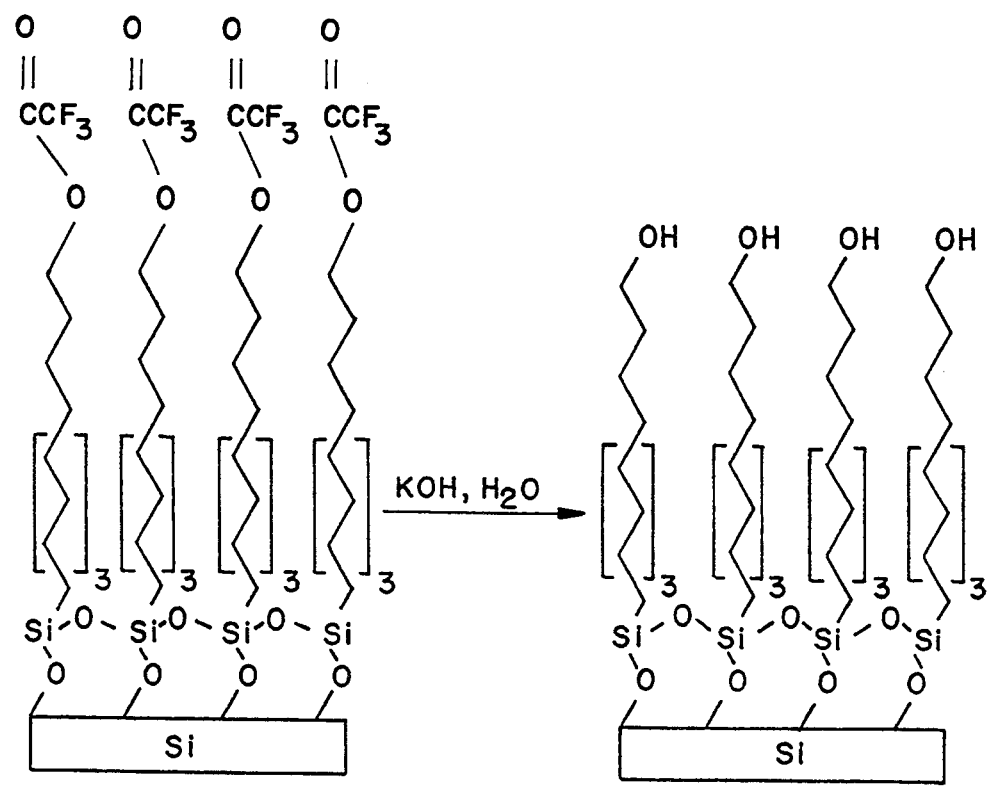

Self-assembled monolayers may be characterized as being a two-dimensional crystalline-like monolayers. They form a close-packed and highly-ordered ultra-thin films. The thickness of the SAM depends on the number of C atoms on the hydrocarbon chain and on the size of the terminating moiety; $25\pm3$ Å is a typical range for a film with 16-C chains. The distance between two carbon atoms on adjacent hydrocarbon molecules is about 4.25 to about 4.35 Å. The carbon chains are tilted from about 5° to about 15° from normal to surface. FIG. 1 sets forth the steps involved in the synthesis of self-assembled monolayer film with a terminating sulfonate group.

For example, in the case of synthesis of $TiO_2$ thin films, Ti-containing films were deposited onto organic layers from alkoxide-ethanol solutions at room temperature. The organic layers consisted of self-assembled monolayer films (SAM), on single-crystal Si wafers and glass, functionalized with either —OH or —COOH groups. The composition and structure of the Ti-containing films were characterized using X-ray photoelectron spectroscopy (XPS), Auger electron spectroscopy (AES), scanning electron microscopy (SEM), and transmission electron microscopy. Films containing 25 atomic % Ti as thin as 50 Å were successfully deposited. Thicker films were granular. Deposits on SAMs were densely packed and had a uniform particle size of 50 nm, whereas deposits without the SAMs were porous, uneven, and loosely packed.

Thin films of titania ($TiO_2$) find usefulness as high-refractive-index components in multilayer antireflective coatings and optical filters. Titanium dioxide is a high refractive index optical ceramic. In addition, deposition of titania films provides a first step toward formation of ferroelectric and piezoelectric titanate films such as $BaTiO_3$ and $(Pb, La)(Zr,Ti)O_3$.

In another instance, iron-containing thin films were synthesized under ambient conditions. Here, films of goethite (FeOOH) were deposited on $SO_3H$ functionalized SAMs on single crystal Si wafers. The composition and morphology of these films were compared with films on bare Si surfaces (i.e., without the SAM) using XPS, AES SEM and X-ray diffraction methods. The surfaces with the SAMs were found to form densely-packed, nano-sized crystallites.

Using similar techniques, experiments on —OH functionalized SAMs were conducted in the goal of depositing magnetic iron oxides, namely $\gamma$-$Fe_2O_3$ (maghemite) or $Fe_3O_4$ (magnetite). These two oxides may be used in a number of applications in thin film form including use as magnetic recording media. Both can be considered archetypes for multicomponent spinel ferrites.

The long chain hydrocarbons which comprise the SAM may vary in length, although in a preferred embodiment herein there are 16 carbon atoms in the chain. This number of carbons may vary depending on the given situation and the materials that are being processed, although 16 $CH_2$ groups is preferred herein.

The underlying substrate to which the SAM bonds preferably includes an inorganic material with an oxide coating such as silica, glass, alumina, titania or other metal. As seen in FIG. 1, the trichlorosilane functionality at a first end on the long-chain hydrocarbon reacts with the surface of the substrate and forms a strong covalent bond with oxygen present on the surface of the substrate. The second end of the SAM includes a functionality suited for reacting and forming a bond with the resulting metal oxide film.

It should be noted that SAMs can be formed on gold and other metals, but the bonding is different than that described herein. For example, isocyanide end groups anchor to platinum, and aromatic thiols will bond to gold. The trichlorosilane used herein will not bond to gold.

The long chain hydrocarbons of the SAM are such that they extend from the substrate in a direction normal to the substrate. There is crosslinking involving oxygen among the long chains at the surface of the substrate. Each of the long chain hydrocarbons is positioned in a well ordered well packed two-dimensional arrangement such that the individual metal oxide molecules which bond to respective SAM hydrocarbon chains together form a well-ordered well-packed crystalline film. The spacing of the metal oxide molecules is determined by and closely matches the spacing and size of the long chain hydrocarbon molecules extending from the substrate surface.

As a result of using the SAM in synthesizing the metal oxide film, the resulting film is strongly bonded to underlying substrate. It is the SAM that provides the strong bond such that the film is not readily removed from the substrate.

In contrast, if the functional groups (e.g., —OH, —COOH or —SO$_3$H) were not bonded to the second end of long chain hydrocarbons (SAMs) but rather directly to the substrate (i.e., nucleation sites), a resulting metal oxide film formed on these groups might not be strongly bonded to the underlying substrate. Any metal oxide which were to form on the substrate without the presence of SAMs would have several distinct disadvantages over one formed with SAMs. For one, the metal oxide would not be in a continuous well ordered, densely packed crystalline arrangement. Metal oxide would be randomly arranged on the substrate at the random location of the functional groups. Second, the film which were to form would not necessarily strongly adhere to the substrate. It would flake away or be easily removed with the brush of a finger. This is not the case in the present invention which results in a very ordered and adherent thin film arrangement.

After the thin metal oxide film has been formed on the SAM and substrate, the resulting laminated product may be subjected to heat sufficient to burn away the SAM. This was done in the case where an iron hydroxide thin film (FeOOH, known as goethite) was formed on the SAM. The goethite film was heated in order to form the oxide magnetite, Fe$_3$O$_4$, and to cause the film to become magnetic. That is, the oxide is not crystallized as deposited. It was determined that after the SAM burned away, the iron oxide film still strongly adhered to the underlying Si substrate. This result was unexpected.

Figure 2A:
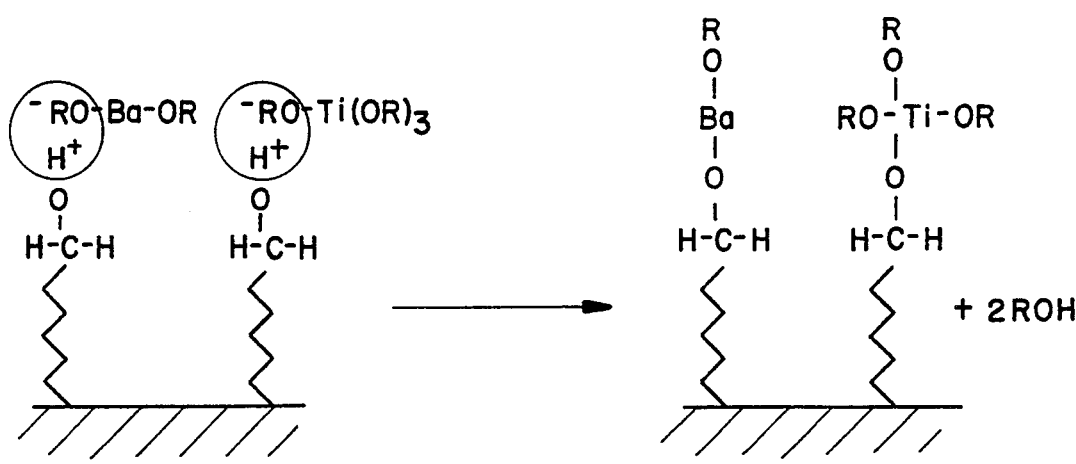
FIGS. 2a, 2b and 2c show the steps involved in the syntheses of barium titanate film on a functionalized self-assembled monolayer.
Figure 2B:
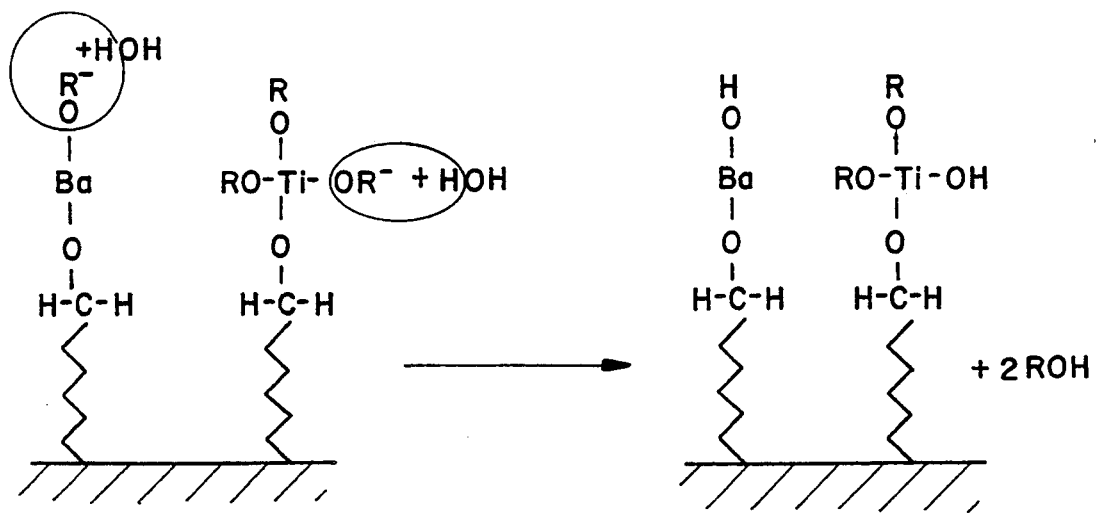
Figure 2C:
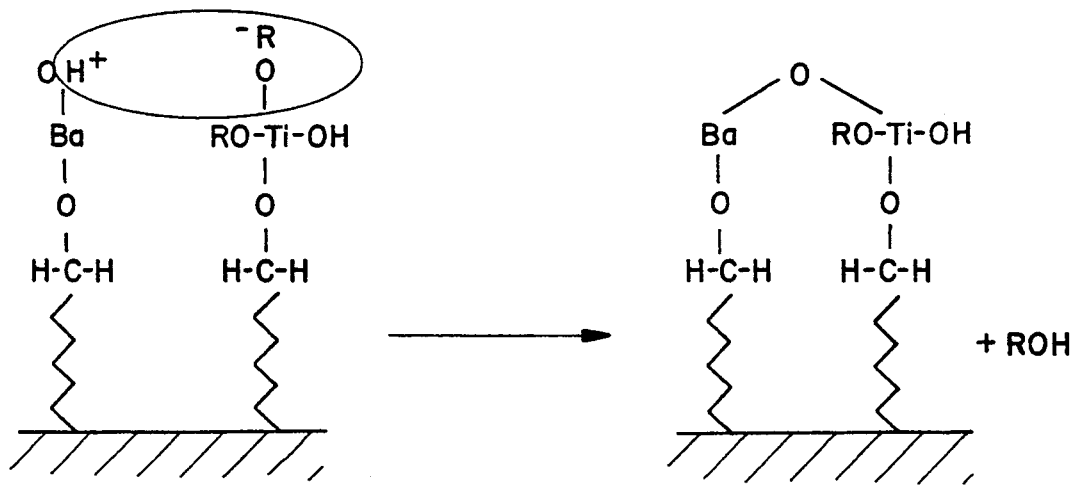
Figure 3:
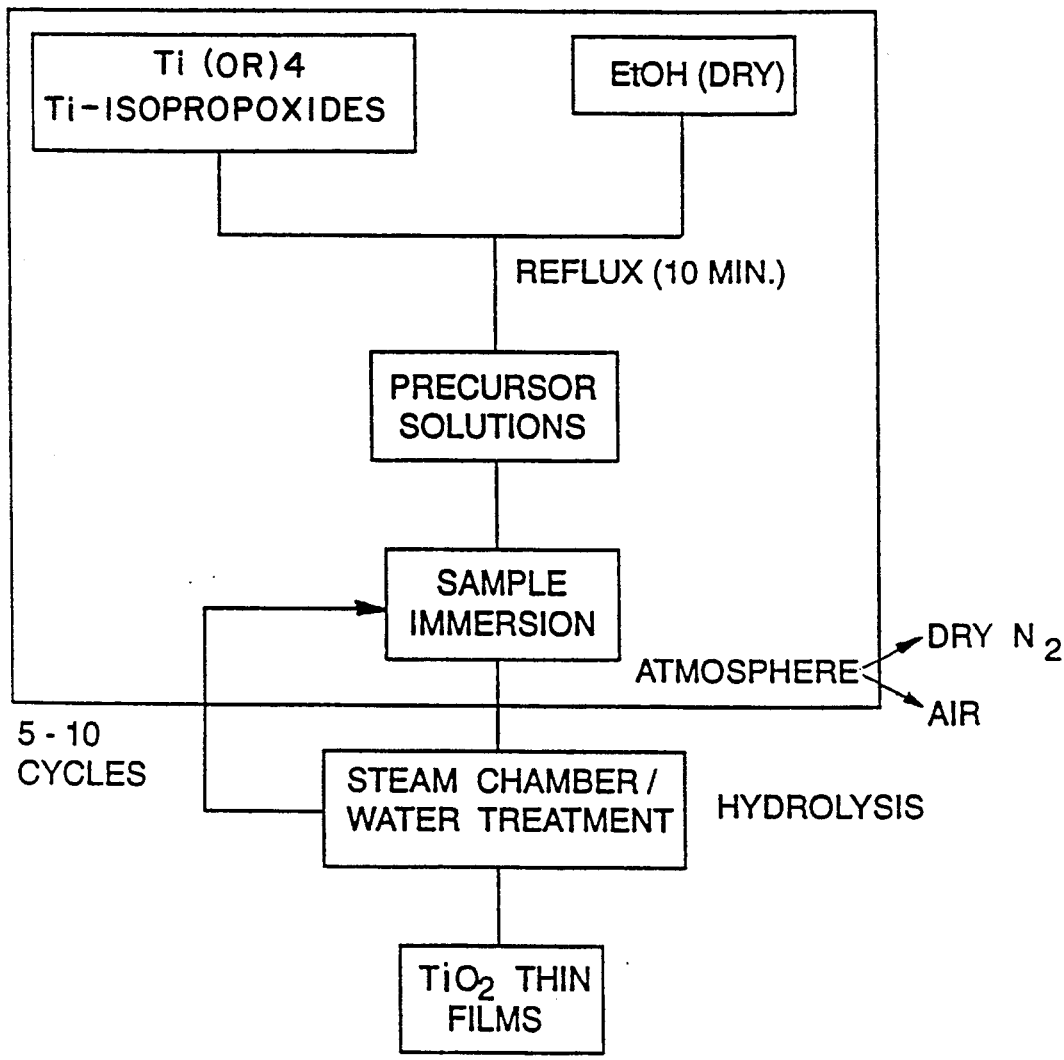
FIG. 3 is a flow chart representing steps involved in preparing $TiO_2$ thin films.
Figure 4A:
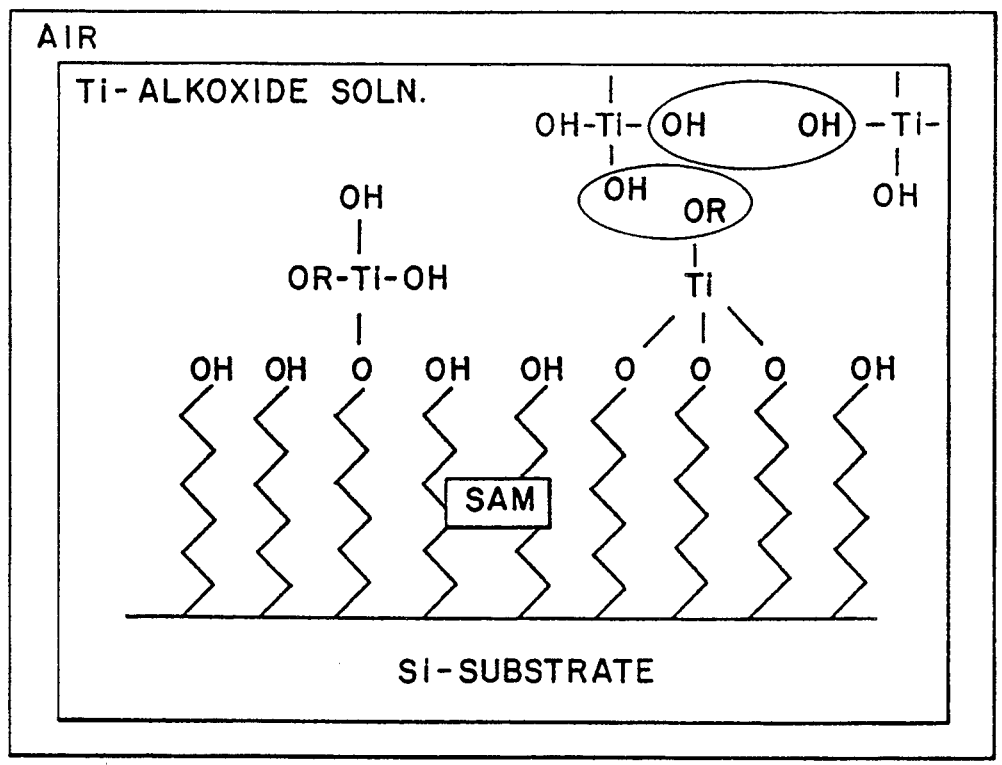
FIGS. 4a and 4b show Ti deposition on a SAM bonded to a silicon substrate in air and nitrogen atmospheres, respectively.
Figure 4B:
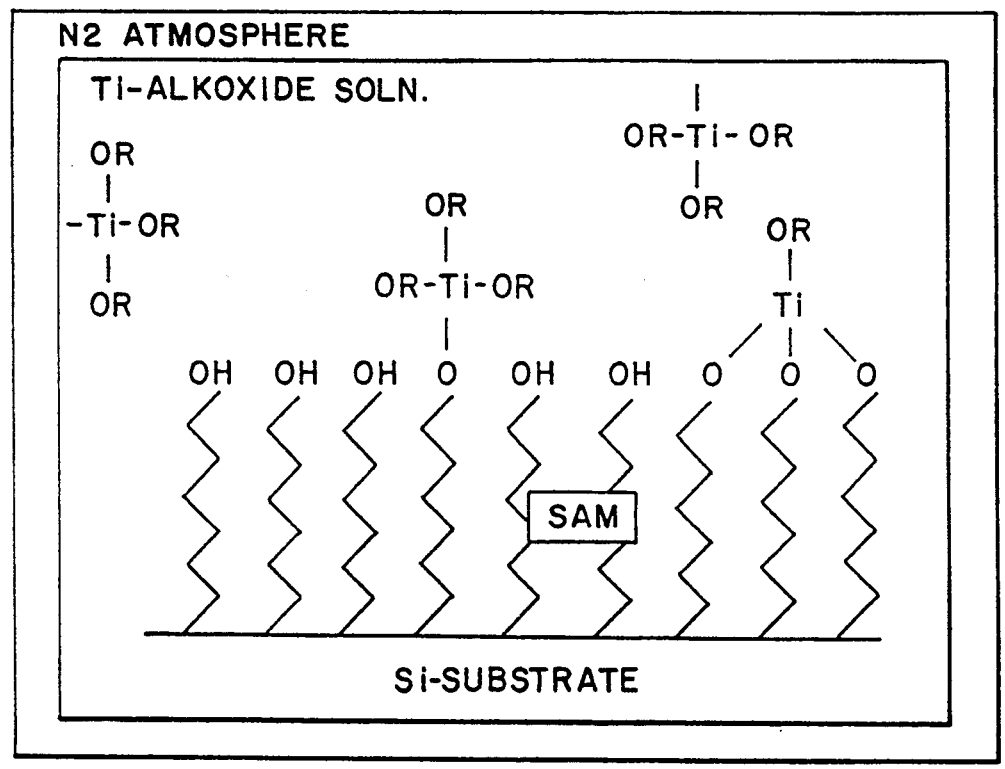

FIGS. 2a, 2b and 2c diagram steps involved in the synthesis of barium titanate film on a functionalized SAM. In those figures, the "+" symbols represent the electrophilic character of the functional groups. The "—" symbols represent the nucleophilic character of the functional groups. FIG. 2a is specifically directed to showing the monoattachment of alkoxides. FIG. 2b identifies a partial hydrolysis step, and FIG. 2c shows condensation.

The "R" represents an alkyl group having 1-5 carbon atoms, preferably 3 (isopropyl) in the case of titanium. The smaller alkyl groups (i.e., methyl and ethyl) hydrolyze too rapidly and alkyl groups larger than the synthesizing propyl group hydrolize too slowly in the case of titanium-containing thin films.

Although much of the discussion herein is directed to synthesis of iron and titanium oxide thin films, the invention is not limited to these materials in any way. For example, the process applies to tin and zinc oxides as well as many other metals and ceramic compositions.

It is further within the scope of the invention that the substrate may be polymeric (i.e., that it may comprise materials such as polystyrene, polyethylene or polyimide) or of other suitable composition. It is recognized that, in situations where the SAM is heated or burned away, such heating might also burn away a polymer substrate. Insofar as this could result in a free-standing oxide film with no underlying support, this eventuality lies within the scope of this invention.

The scope of the present invention further contemplates adding additional monocrystalline metal oxide layers to the thin layer formed on the SAM. The invention contemplates use of conventional lamination techniques as well as attaching SAMs with appropriate metal oxide layers onto the thin film and applying or depositing the next layer thereon.

The present invention is further illustrated by the following examples. It is to be understood that the present invention is not limited to the examples, and various changes and modifications may be made in the invention without departing from the spirit and scope thereof.

EXAMPLES

In preparing to synthesize metal oxide films in accordance with the present invention, SAMs were deposited on glass (microscope cover slips) and on single-crystal [100] Si plates. Prior to the in-situ transformation of the surface functional group, the films were routinely characterized using Fourier transform infrared spectroscopy in the attenuated total internal reflectance mode (ATR-FTIR). One- or two-step transformations were used to install the requisite —OH, —COOH or —SO$_3$H functionalities. At this stage, X-ray photoemission spectroscopy (XPS) was conducted along with additional ATR-FTIR to confirm the exchange of functional groups. To obtain a quick, qualitative measure of the hydrophilicity and packing uniformity of the film, contact angle measurements of water were used. Contact angle hysteresis (i.e., differences in contact angle depending on whether the liquid is advancing or receding over the surface) were used as an additional measure of film packing.

Example 1

An experiment concerning the deposition of Fe-containing films was conducted using SO$_3$H-functionalized SAMs on a silicon substrate. Bare Si wafers were used as control specimens. A solution concentration of 0.1M FeCl$_3$+0.005M HCl was prepared. This solution was selected because it provided the highest concentrations of deposited Fe consistent with an absence of visible precipitation in the bulk solution in air. The SAMs and bare Si wafers were exposed to this solution at 100° C. in air for varying times up to 2 hours.

Images from the scanning Auger microprobe showed that densely packed, adherent, continuous layers formed on the SAMs, whereas cracked, flaky, nonadherent coatings formed on the bare Si. Depth profiling of a film that had been exposed to the solution for 15 min. gave a thickness of about 300 Å. The iron XPS peak at 711.05 eV identified the film as FeOOH or Fe$_2$O$_3$ (hematite). Exposures of 1-2 hours produced films with XRD patterns of a single peak, the (310) peak at 3.30 Å of the Fe(III) oxy-hydroxide goethite (FeOOH). The absence of any other peaks (including the I=100 peak) suggests that the deposited inorganic layer may have had preferred orientation. The color and absence of magnetic behavior in these films were consistent with the assignment of goethite. Similar experiments on —COOH and —OH functionalized SAMs yielded essentially similar results.

To convert the goethite to an oxide, the film was heated at 250°–400° C. for 4 hrs. in air. Although it can be assumed that this heat treatment decomposed the SAM, the inorganic layer was still adherent on the Si, and the Auger images showed it to be dense, continuous, and uncracked. It was identified using XRD as $\alpha$-Fe$_2$O$_3$ (hematite). This film was then heated at 400°–600° C. for 4–5 hrs. in vacuum. The film turned black and magnetic. The XPS Fe peak energies of the heat treated films were consistent with the assignments of hematite and magnetite.

It was determined that superior film quality was obtained with the SAM as opposed to bare Si.

Example 2

The initial set-up of the above experiment was repeated for a longer time and at a slightly different concentration. The bare Si substrate and the Si substrate with SAM having an SO$_3$H functional group were exposed to a solution of 0.018M FeCl$_3$ and 0.001M HCl at 100° C. for 3 hours. Upon XPS analysis, the bare silicon wafer (i.e., the control) was observed as having about 14.99 atomic % Fe deposited to its surface. The SAM-SO$_3$H on silicon wafer showed about 24.52 atomic % Fe. From this, it was concluded that there was a large deposition of Fe, and that SAM appears to make a substantial difference to the attachment of Fe to the substrate.

Example 3

Titanium-containing thin films were synthesized. An isopropoxide precursor was used. In other words, 0.004 mol of titaniumisopropoxide, Ti(OC$_4$H$_9$)$_4$ in 350 ml of ethanol was prepared. substrates for the SAMs were either Si or glass. All depositions were carried out on 0H-functionalized SAMs to induce anchoring of the Ti to the SAM by the hydrolysis of the isopropoxide:

Ti(OR)$_4$+SAM—OH$\rightleftharpoons$SAM—O—Ti(OR)$_3$+ROH

This step may proceed to form two or more Ti—O bonds to the SAM. The actual number will depend on whether an attached isopropoxide molecule will block others from attaching, as well as on the relative kinetics of monoattachment and subsequent attachments. On the basis of the tetrahedral configuration of the titanium isopropoxide molecule, it seems unlikely that all four —OR groups would hydrolyze, so that at least one would always remain for the subsequent condensation reaction.

Times for exposure of the SAM to the isopropoxide solution ranged from 1 to 10 minutes at room temperature in air.

To insure complete hydrolysis of the attached isopropoxide, the SAM was removed from the solution and placed in a steam chamber for 10 minutes. Then, assuming the hydrolyzed Ti could serve as attachment sites for additional isopropoxide molecules, the sample was immersed again in the alkoxide solution. This sequence was repeated from 1 to 15 times.

SEM images of films on glass showed dense, monosized, submicron granular films on SAMs, but porous, loosely packed deposits on bare glass although, like the Fe-containing films, the primary particle size was similar with or without the SAM (here, about 100 nm). After 5 or more cycles, XPS of the films on glass substrates showed that they contained only Ti, O, and C (presumably adventitious). The maximum Ti concentration was 15 at %. During depth profiling, the O peaks showed a continuous shift from the position characteristic of Ti in TiO$_2$ (530 eV) to that of SiO$_2$ (534.5 eV); a 5-cycle film was about 100 Å thick. XRD of an as-deposited 15-cycle film showed a single XRD peak at 3.350 Å. The closest match to this peak among Ti-oxides in the JCPDS file is 3.326 Å (I=100) for Ti$_2$O$_3$; the I=100 peaks for anatase and rutile (polymorphs of TiO$_2$) bracket the observed peak (3.25 and 3.52 Å). Films from fewer cycles on glass gave non-crystalline XRD patterns.

OH-SAMs were also deposited on [100] Si. One 10-minute immersion of a Si—SAM—OH substrate into a Ti-isopropoxide/EtOH solution, followed by 10 minutes of steam exposure produced a film with 25 at % Ti in AES with a sputter depth of about 50 Å. The XPS Ti peaks (2p$_{3/2}$ at 458.7 eV and 2p$_{\frac{1}{2}}$ at 464.4 eV) were in precise agreement with Ti peaks in TiO$_2$. However, in multiple-cycle exposures similar to those used for glass, films on Si appeared to level off at lower overall Ti content as a function of immersion time.

Example 4

The following experimental procedure was followed in the deposition of magnetic iron oxide on self-assembled monolayers.

The first step entailed the deposition of FeOOH acid hydrolysis. A solution of 0.1M FeCl$_3$ was prepared. A solution of 0.005M HCl was prepared. About 5/10 ml of the mixture was kept in a beaker immersed in a water bath kept at a constant temperature of 100° C. A Si substrate with the attached self-assembled monolayer (SAM) characterized with a —SO$_3$H— functionality was kept immersed in the solution beaker. The substrate was kept in the solution for about 1 hr.

The second step involved characterization and identification of the deposited thin film, Auger analysis and XPS results confirm a uniform adherent layer of FeOOH (Goethite). The phase is confirmed as FeOOH by X-ray diffraction.

The third step involved oxidation of deposited FeOOH by thermal aging. The Si wafer with the deposited FeOOH was kept in a furnace at 300° C. for about 4 hours. XPS and X-ray diffraction results indicate the oxidation of FeOOH to the higher stable oxide $\alpha$-Fe$_2$O$_3$ (Hematite).

The fourth step involved transformation of Fe$_2$O$_3$ to a magnetic iron oxide. The Si wafer with the deposited hematite, Fe$_2$O$_3$, was kept in a vacuum furnace at 500° C. for about 3 hours. The vacuum is about 2×10$^{-5}$ torr. The film was characterized by X-ray diffraction, XPS, and TEM. Further, the film of Si gave a positive indication when tested with a magnet.

Example 5

An experiment was conducted to deposit magnetite/-maghemite on Si with SAMs. A solution of FeSO$_4$ was prepared by dissolving 80 gms. of FeSO$_4$.7H$_2$O in 560 ml. of deionized water (almost 1M) which had been flushed with $N_2$. The solution was then poured into a 1 liter reaction vessel having an air-tight plastic lid with a hole for insertion of a drop funnel. A water bath was prepared by filling a 3 liter beaker with distilled water and heating it to 90° C. on a hot plate. The bath temperature was monitored with a thermometer such that the temperature was kept constant. The reaction vessel was maintained on a support inside the water bath. Si chips or wafers were kept inside the reaction vessel. The Si wafers had an —OH functionality.

A 2M solution of $KNO_3$ (20.20 gms. of $KNO_3$ in 100 ml of distilled water) was prepared. About 30 ml of the solution was placed in a drop funnel attached to the mouth of a reaction vessel.

The $KNO_3$ solution was added dropwise at a very slow rate and Si wafers were removed subsequently at the end of:
a) 1 min.
b) 2 min.
c) 10 min.
d) 15 min.

For purposes of control, the entire experiment was repeated with bare Si wafers, i.e., Si without —OH functionalities.

The experiment was again repeated with $H_2O_2$, instead of $KNO_3$. This was done for the purpose of deposition maghemite ($2\text{-}Fe_2O_3$)

The entire experiment was conducted in a glove box with $N_2$ instead of air.

These deposits were not too successful. The $KNO_3$ route left a K—Fe—O—H layer. The $H_2O_2$ route did not deposit much Fe onto the SAM.

Example 6

Iron(hydrous) oxides were deposited on SAMs from ferrous hydroxide gels. In this experiment, the procedure called for dipping the SAM in an acidic solution of $FeSO_4$ followed by dipping the SAM in distilled water. Thereafter, the SAM was dipped in a KOH solution, followed by dipping in distilled water. Finally, the SAM was dipped in a $KNO_3$ solution. The entire experiment was conducted in an inert nitrogen atmosphere at 80° C.

This experiment is based on the oxidative hydrolysis of Fe(II) solutions by slow oxidation and the knowledge that magnetite has been prepared under a nitrogen atmosphere at 90° C. by the slow addition of KOH+-$KNO_3$ to a solution of Fe $SO_4.7H_2O$ according to the following reactions:

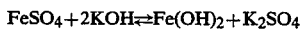

$$FeSO_4 + 2KOH \rightleftarrows Fe(OH)_2 + K_2SO_4$$

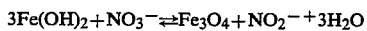

$$3Fe(OH)_2 + NO_3^- \rightleftarrows Fe_3O_4 + NO_2^- + 3H_2O$$

The results of this experiment were less than favorable.

Example 7

Another experimental procedure involves dipping the SAM in an acidic solution of Fe(II)+Fe(III) for 30 min; rinsing the SAM in distilled water; and then dipping the SAM in concentrated NaOH solution for 30 min. These steps are conducted in a nitrogen atmosphere at about 80° C. This procedure is based on the knowledge that fine black magnetite particles were formed when acidic solutions of $Fe(ClO_4)_2$ and $Fe(ClO_4)_3$ were slowly neutralized by slow addition of NaOH/KOH until a pH of 6-7 was reached. The colorless acidic solution first turned brown due to formation of dark red complex $[Fe(II)_1Fe(III)_2O_x(OH)_{2(3-x)2m}]^+$. The complex then reduced to magnetite on further adding $OH^-$ to the solution. The reaction was conducted in a $N_2$ atmosphere at about 80° C. according to the following equation:

$$mFe(II) + 2mFe(III) + 6mOH^- = complex + mxH_2O$$

The results of this experiment were less than favorable.

The invention has been described with reference to the preferred embodiments. Obviously modifications and alterations will occur to others upon a reading and understanding of this specification. It is intended to include all such modifications and alterations insofar as they come within the scope of the appended claims or the equivalents thereof.

We claim:

1. A method for synthesizing a metal oxide thin film, comprising the steps of:
    providing a substrate having an oxide layer at its surface;
    covalently bonding a first end of a chain hydrocarbon to the surface of the substrate, the first end of the chain hydrocarbon having a first functional group which covalently bonds with the oxide at the substrate surface, a second end of the chain hydrocarbon having a second functional group providing a bonding site for a metal oxide in solution; and
    depositing metal oxides on the second functional groups.

2. The method of claim 1 wherein the substrate is glass.

3. The method of claim 1 wherein the substrate is silicon.

4. The method of claim 1 wherein the substrate is selected from the group consisting of Ge, Al, Si and Ti wherein a surface of said substrate includes an oxide.

5. The method of claim 1 wherein the chain hydrocarbon includes 16 carbon atoms.

6. The method of claim 1 wherein the first functional group is trichlorosilane.

7. The method of claim 1 wherein the second functional group is OH.

8. The method of claim 1 wherein the second functional group is COOH.

9. The method of claim 1 wherein the second functional group is $SO_3H$.

10. The method of claim 1 wherein the metal oxide formed on the chain hydrocarbon is an iron-containing oxide or hydroxide.

11. The method of claim 1 wherein the metal oxide formed on the chain hydrocarbon is a titanium-containing oxide.

12. The method of claim 1 wherein the metal oxide formed on the chain hydrocarbon is a zinc or tin-containing oxide.

13. The method of claim 1 wherein a plurality of chain hydrocarbons bond to the substrate and crosslink together along the surface of the substrate, the chain hydrocarbons being uniformly spaced from one another.

14. The method of claim 13 wherein a plurality of metal oxides bond to the hydrocarbons and to one another to provide a uniform ordered arrangement defined by the uniform arrangement of the hydrocarbons.

15. A method for synthesizing a thin film metal oxide, comprising the steps of:
   forming a self-assembled monolayer on a surface of a substrate;
   immersing the substrate and self-assembled monolayer into an organometallic or aqueous salt solution; and
   depositing a metal oxide film on the self-assembled monolayer.

16. The method of claim 15 wherein the film is subsequently heated to burn away the self-assembled monolayer, leaving the metal oxide film bonded directly to the substrate.

17. The method of claim 15 wherein an ordered surface arrangement on the self-assembled monolayer induces crystallinity in forming the metal oxide film.

18. The method of claim 15 wherein the step of depositing a metal oxide occurs at a temperature below 100° C.

19. The method of claim 15 wherein the step of forming the self-assembled monolayer on a substrate includes the step of bonding a trichlorosilane functional group on the self-assembled monolayer to an oxide present at the surface of the substrate.

20. The method of claim 15 wherein the step of immersing is conducted for about 10 to 20 minutes in air at room temperature.

21. A method for synthesizing a metal oxide thin film, comprising the steps of:
   providing a substrate having an oxide layer at its surface;
   covalently bonding a first end of a chain hydrocarbon to the surface of the substrate, the first end of the chain hydrocarbon having a first functional group which covalently bonds with the oxide at the substrate surface, a second end of the chain hydrocarbon having a second functional group providing a bonding site for metals in solution wherein the second functional group is COOH; and
   forming metal oxides on the second functional groups.

22. A method for synthesizing a metal oxide thin film, comprising the steps of:
   providing a substrate having an oxide layer at its surface;
   covalently bonding a first end of a chain hydrocarbon to the surface of the substrate, the first end of the chain hydrocarbon having a first functional group which covalently bonds with the oxide at the substrate surface, a second end of the chain hydrocarbon having a second functional group providing a bonding site for metals in solution wherein the second functional group is $SO_3H$; and
   forming metal oxides on the second functional groups.

23. A method for synthesizing a metal oxide thin film, comprising the steps of:
   providing a substrate having an oxide layer at its surface;
   covalently bonding a first end of each of a plurality of chain hydrocarbons to the surface of the substrate, the first end of the chain hydrocarbon having a first functional group which covalently bonds with the oxide at the substrate surface, a second end of each chain hydrocarbon having a second functional group providing a bonding site for metals in solution;
   crosslinking the chain hydrocarbons along the surface of the substrate, the chain hydrocarbons being uniformly spaced from one another; and
   forming metal oxides on the second functional groups wherein a plurality of metal oxides bond to the hydrocarbons and to one another to provide a uniform ordered arrangement defined by the uniform arrangement of the hydrocarbons.

24. A method for synthesizing a thin film metal oxide, comprising the steps of:
   forming a self-assembled monolayer on a surface of a substrate;
   immersing the substrate and self-assembled monolayer into an organometallic or aqueous salt solution;
   forming a metal oxide film on the self-assembled monolayer; and
   subsequently heating the film to burn away the self-assembled monolayer, leaving the metal oxide film bonded directly to the substrate.

25. A method for synthesizing a thin film metal oxide, comprising the steps of:
   forming a self-assembled monolayer on a surface of a substrate;
   immersing the substrate and self-assembled monolayer into an organometallic or aqueous salt solution; and
   forming a metal oxide film on the self-assembled monolayer, wherein an ordered surface arrangement on the self-assembled monolayer induces crystallinity in forming the metal oxide film.

* * * * *